US012723785B2

(12) United States Patent
Nagimov

(10) Patent No.: US 12,723,785 B2
(45) Date of Patent: Sep. 1, 2026

(54) THERMOELECTRIC COUPLER FOR SELECTIVE HEAT TRANSFER BETWEEN COOLANT LOOPS IN A DEVICE COOLING SYSTEM

(71) Applicant: Microsoft Technology Licensing, LLC, Redmond, WA (US)

(72) Inventor: Ruslan Nagimov, Snohomish, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 245 days.

(21) Appl. No.: 18/357,331

(22) Filed: Jul. 24, 2023

(65) Prior Publication Data

US 2025/0035346 A1 Jan. 30, 2025

(51) Int. Cl.
*F25B 21/04* (2006.01)
*H05K 7/20* (2006.01)

(52) U.S. Cl.
CPC ......... *F25B 21/04* (2013.01); *H05K 7/20263* (2013.01); *H05K 7/20281* (2013.01); *F25B 2321/0212* (2013.01); *F25B 2321/0251* (2013.01); *F25B 2321/0252* (2013.01)

(58) Field of Classification Search
None
See application file for complete search history.

(56) References Cited

U.S. PATENT DOCUMENTS 6,418,728 B1 * 7/2002 Monroe ................ F24F 5/0042 62/3.2
9,983,641 B2 5/2018 Kulkarni
11,249,522 B2 * 2/2022 Kulkarni ................ G06F 1/206
2009/0249796 A1 * 10/2009 Ullman .................. F25B 21/02 62/3.7
2012/0047911 A1 * 3/2012 Bhavsar .................. F25D 11/00 62/3.6
2013/0199208 A1 * 8/2013 Shi .......................... F25B 21/02 62/3.2
2014/0318152 A1 * 10/2014 Ghoshal .................. F25B 21/02 62/3.2

(Continued)

FOREIGN PATENT DOCUMENTS

DE 102021126963 A1 * 4/2023 .............. F25B 9/008
WO WO-2013052823 A1 * 4/2013 .............. F25B 21/02

(Continued)

OTHER PUBLICATIONS

"CP13535", Retrieved from: https://www.digikey.com/en/products/detail/cui-devices/CP13535/6217732, Retrieved Date: Jun. 26, 2023, 6 Pages.

(Continued)

*Primary Examiner* — Jenna M Maroney
(74) *Attorney, Agent, or Firm* — Holzer Patel Drennan

(57) ABSTRACT

A device cooling system includes a first coolant loop that circulates a first cooling media through a device; a second coolant loop that circulates a second cooling media through the device; a thermoelectric cooler (TEC) positioned between the first coolant loop and the second coolant loop; and control electronics configured to selectively drive the TEC to transfer heat between the first coolant loop and the second coolant loop.

16 Claims, 11 Drawing Sheets

(56) References Cited

U.S. PATENT DOCUMENTS

| | | | | |
|---|---|---|---|---|
| 2016/0003503 | A1* | 1/2016 | Novisoff | F25B 21/02 62/3.3 |
| 2017/0350634 | A1 | 12/2017 | Boarman | |
| 2018/0031285 | A1* | 2/2018 | Thomas | F25B 21/04 |
| 2019/0383528 | A1* | 12/2019 | Sung | F25B 21/02 |
| 2024/0401857 | A1* | 12/2024 | Langer | F25B 41/40 |
| 2025/0035346 | A1* | 1/2025 | Nagimov | H05K 7/20727 |

FOREIGN PATENT DOCUMENTS

| | | | | |
|---|---|---|---|---|
| WO | WO-2014164887 | A1 * | 10/2014 | A61M 13/003 |
| WO | WO-2022228925 | A1 * | 11/2022 | B60L 1/02 |

OTHER PUBLICATIONS

International Preliminary Report on Patentability (Chapter I) received for PCT Application No. PCT/US2024/036294, mailed on Feb. 5, 2026, 6 pages.

International Search Report and Written Opinion received for PCT Application No. PCT/US2024/036294, Oct. 1, 2024, 12 pages.

* cited by examiner

THERMOELECTRIC COUPLER FOR SELECTIVE HEAT TRANSFER BETWEEN COOLANT LOOPS IN A DEVICE COOLING SYSTEM

BACKGROUND

Different components within a server are characterized by different heat generation patterns, cooling needs, and recommended operating temperature ranges. To address the foregoing, modern server cooling systems typically include multiple coolant loops that support flows of different cooling media. Liquid coolant loops provide more cooling capacity than air coolant loops; consequently, liquid coolant loops are typically used to cool especially hot components. Air cooling is less expensive in terms of equipment costs and is therefore preferred when sufficient to satisfy component cooling needs. In general, graphics processing units (GPUs) run much hotter than computer processing units (CPUs) and it is therefore common to cool GPU banks with cold plates that house channels for circulating liquid coolant and to cool CPU banks with air circulated by fans. In these modern cooling systems, different coolant loops are individually sized to support peak capacity. This leads to costly integration of large-capacity coolant loops that are underutilized in most nominal operating conditions.

In addition to the aforementioned cooling system inefficiencies pertaining to overscale and underusage, some modern data centers also face power utilization challenges unique to large scale training of artificial intelligence models. These large-scale AI training operations include repeated distributed computations involving thousands of GPUs interconnected by high-bandwidth networks. These computations are synchronous in that all the GPUs switch on and off in tandem. These synchronous workloads being performed by many servers in a data center lead to power draw that fluctuates from zero to full load, often multiple times in a manner of seconds. The use of a power grid is typically conditioned, by the utility provider, on usage patterns of the customer being consistent with predefined "acceptable" power usage patterns. The extreme oscillations that a data center can observe in the above-described scenario generate electrical noise that can propagate back into the power grid and cause disturbances observed by other electric customers. Consequently, data centers are incentivized to reduce or eliminate these extreme power oscillations.

As an alternative to the public power grid, data centers might utilize batteries and generators to supplement energy needs and reduce the impact of oscillatory power consumption patterns on the power grid. However, the extreme power oscillations observed cause batteries to cycle quickly and unnecessarily wear generators, significantly reducing lifetimes of these expensive components. Still another solution being explored by data centers entails creating "dummy loads" by sending current through resistive banks and/or powering up heaters during times when GPU load is low, thereby reducing the delta between power consumption observed at non-peak times and peak times. Notably, these dummy loads waste power and are monetarily expensive to support.

SUMMARY

According to one implementation, a device cooling system includes a first coolant loop that circulates a first cooling media through a device; a second coolant loop that circulates a second cooling media through the device; a thermoelectric cooler (TEC) positioned between the first coolant loop and the second coolant loop; and control electronics configured to drive the TEC to transfer heat between the first coolant loop and the second coolant loop This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Other implementations are also described and recited herein.

DETAILED DESCRIPTION

Figure 1:
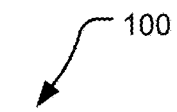
FIG. 1 illustrates an example cooling system that utilizes a thermoelectric cooler (TEC) to transfer heat between different coolant loops.
Figure 1:
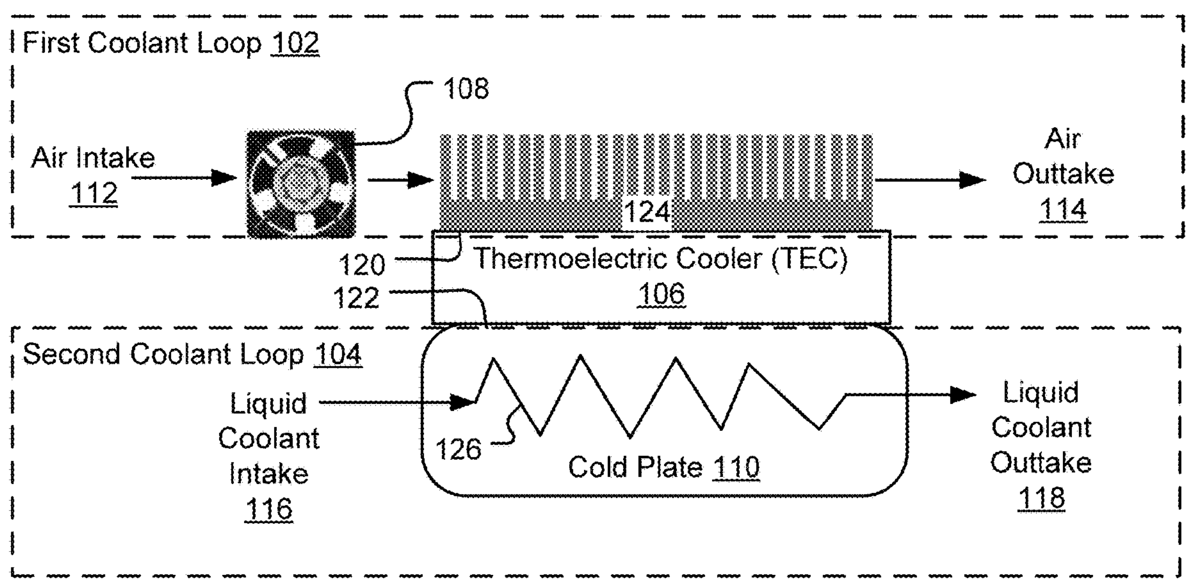

The technology disclosed herein pertains to an improved cooling system that allows for selective heat transfer between different coolant loops. In one implementation, this improved cooling system facilitates a down-size in the relative cooling capacity of individual different coolant loops that circulate cooling media, saving on both component costs and operational costs. Interestingly, this system also presents a unique solution to the above-described power management challenges related to large-scale machine learning operations within a data center. By selectively turning "on" and "off" heat transfer between the coolant loops at off-peak power consumption times, extreme system power oscillations can be mitigated. Alternatively, the same heat transfer mechanism can be selectively controlled consistent with other criteria to help satisfy a myriad of other performance-related objectives including mitigating total energy consumption of the device and extending component lifetimes.

As used herein, "different coolant loops" refer to coolant loops that operate substantially thermally independent of one another in the sense that the loops are not thermally coupled aside from the natural and inadvertent heat transfers that may occur between components positioned in close proximity in a closed system. Stated different, "different coolant loops" are not designed to transfer heat to one another and nominal operation of a cooling system with different coolant loops does not depend upon heat transfer between the different coolant loops. The herein disclosed technology pertains to a selectively-controlled thermal coupling between two coolant loops that are otherwise (aside from this thermal coupling) substantially thermally independent of one another. When the selective heat transfer mechanism is disabled (e.g., powered off), the different loops operate in a substantially thermally independent manner. An example device employing different coolant loops includes a first air-cool loop driven by one or more fans and a second liquid-cooled loop driven by one or more pumps. In active cooling systems, different coolant loops include different cooling sources (e.g., fan(s), pumps, chillers).

According to one implementation, a disclosed cooling system includes a thermoelectric cooler (TEC) that thermally couples (e.g., supports heat transfers between) two coolant loops that are otherwise substantially thermally independent of one another. When in an "on" state, the TEC pulls heat away from a first side (the "cool side") and conducts the heat toward a second opposite side (the "hot side"). The first side of the TEC is thermally coupled with a first coolant loop and the second opposite side of the TEC is thermally coupled with a second coolant loop that is. As will be apparent from the following figures, the first and second coolant loops may, in different implementations, circulate the same or different types of cooling media. Notably, some TECs can be operated bidirectionally such that it is possible to switch the direction of heat transfer (e.g., swapping the cool side and the hot side).

In some implementations, the TEC is selectively driven to satisfy a defined device-level (e.g., server) or system-level (e.g., data center) performance objective. As used herein "performance objective" refers to either a thermal objective or a power-consumption objective.

One example power-consumption objective seeks to mitigate the power oscillations observed between peak and non-peak times at a data center by selectively and concurrently driving TECs within each of multiple servers at times when the data center is otherwise experiencing very low (near minimum) power utilization. As mentioned elsewhere herein, the synchronous computations employed to train a machine learning model can cause thousands of GPUs to turn on and off in tandem, yielding extreme power oscillations that most utility providers refuse to support. If, however, the TECs within each of the servers are synchronous driven at times when the GPUs are quiet (off-peak), these power oscillations can be eliminated or significantly mitigated while advantageously pulling heat away from the "hot" GPUs (a power-savings advantage over currently-proposed power oscillation mitigation solutions, which needlessly generate even more power in dummy loads that increases total system cooling needs and power consumption).

One example thermal objective seeks to minimize total overhead (e.g., energy utilized) by the cooling system by balancing heat between the two different coolant loops. For example, heat may be selectively transferred from a liquid-coolant loop to an air-coolant loop at times when the liquid-cooled loop is running hotter than the air-coolant loop and/or when liquid-cooled components are running with peak power while air-cooled components are running with comparatively reduced power within the same device. Using a TEC to selectively balance heat between two different coolant loops can reduce total net energy consumed by a cooling system as compared to thermally-independent coolant loop operation due, in part, to the fact that the heat transfer capability allows the individual loops to be downsized for reduced cooling capacity. This downsizing saves more energy than that consumed by powering the TEC to maintain the coolant loops within their respective target operating temperature ranges.

Another example thermal objective seeks to maintain one or more device components within a designated temperature range (e.g., an optimal temperature range identified by the component manufacturer) by selectively transferring to or from the coolant loop(s) tasked with cooling the component (s). This objective can, for example, improve component performance and/or extend component lifetime while also reducing cooling system overhead as compared to selectively driving fans or coolant pumps to achieve the same target component temperatures.

FIG. 1 illustrates an example cooling system 100 that utilizes a thermoelectric cooler (TEC 106) to transfer heat between different coolant loops. The cooling system 100 includes a first coolant loop 102 used to circulate a first cooling media through one or more channels and a second coolant loop 104 used to circulate a second cooling media through the one or more channels.

Aside from the thermal coupling formed by the TEC 106 (discussed below), the first coolant loop 102 is substantially thermally independent of the second coolant loop 104. In one implementation, the cooling system 100 is included within a device housing and the first coolant loop 102 and the second coolant loop 104 are positioned to cool different respective banks of heat-generating components within the device housing.

The TEC 106 is positioned between the first coolant loop 102 and the second coolant loop 104 and provides a thermal coupling between the two loops that can be actively enabled and disabled by providing power to and removing power from the TEC 102. When the TEC 106 is powered off, the first coolant loop 102 is substantially thermally independent of the second coolant loop 104.

In various implementations, the first cooling media and the second cooling media circulated through the two respective coolant loops may be of the same or different matter phases (e.g., both gas, both liquid, one gas and one liquid) and are, in various implementations, maintained within the same or different temperate ranges. By example, the first coolant loop 102 is shown to be an air-coolant loop and the second coolant loop 104 is a liquid-cooled loop that includes a cold plate (e.g., cold plate 110) housing a channel 126 that receives a liquid coolant.

In some implementations, the first coolant loop 102 and/or the second coolant loop 104 are passively driven (e.g., without reliance on active cooling sources such as pumps or fans). However, in FIG. 1, the first coolant loop 102 and the second coolant loop 104 are shown to be actively-driven coolant loops. Within the first coolant loop 102, air is circulated by one or more fans (e.g., a fan 108)

between an air intake 112 and an air outtake 114. Within the second coolant loop 104, liquid coolant is circulated by one or more pumps (not shown) between a liquid coolant intake 116 and a liquid coolant outtake 118. For example, the pump(s) are housed in a cooling tank reservoir external to a device that houses the illustrated components of the cooling system 100.

As shown, the first side 120 of the TEC 106 is thermally coupled to the first coolant loop 102 and a second side 122 of the TEC 106 is thermally coupled to the second coolant loop 104. In different implementations, these thermal couplings are achieved using various coupling techniques and thermal components readily known to cooling system engineers and used for heat transfer purpose in other cooling system designs. In FIG. 1, the first side 120 of the TEC 106 is in direct contact with an air-cooled heat sink 124 that includes fins that contact the first cooling media (e.g., the air) as it circulates through the first coolant loop 102. The second side 122 of the TEC 106 is shown to be conductively coupled to (e.g., in direct contact with) the cold plate 110 including the channel 126 that circulates the second cooling media (e.g., liquid coolant).

When powered on, the TEC 106 transfers heat from one side of the TEC 106 to the other, opposite side. In one implementation, the TEC 106 is configured for single-direction heat transfer. For example, the TEC 106 is selectively powered on and off to start and stop the transfer of heat from the second side 122 to the first side 120 (or vice versa). In other implementations, the TEC 106 is configured to provide selective bidirectional heat transfer. For example, the TEC 106 is selectively configurable in a first heat transfer mode to provide heat transfer from the second side 122 to the first side 120 and selectively reconfigurable in a second heat transfer mode to provide heat transfer from the first side 120 to the second side 122.

Figure 2A:
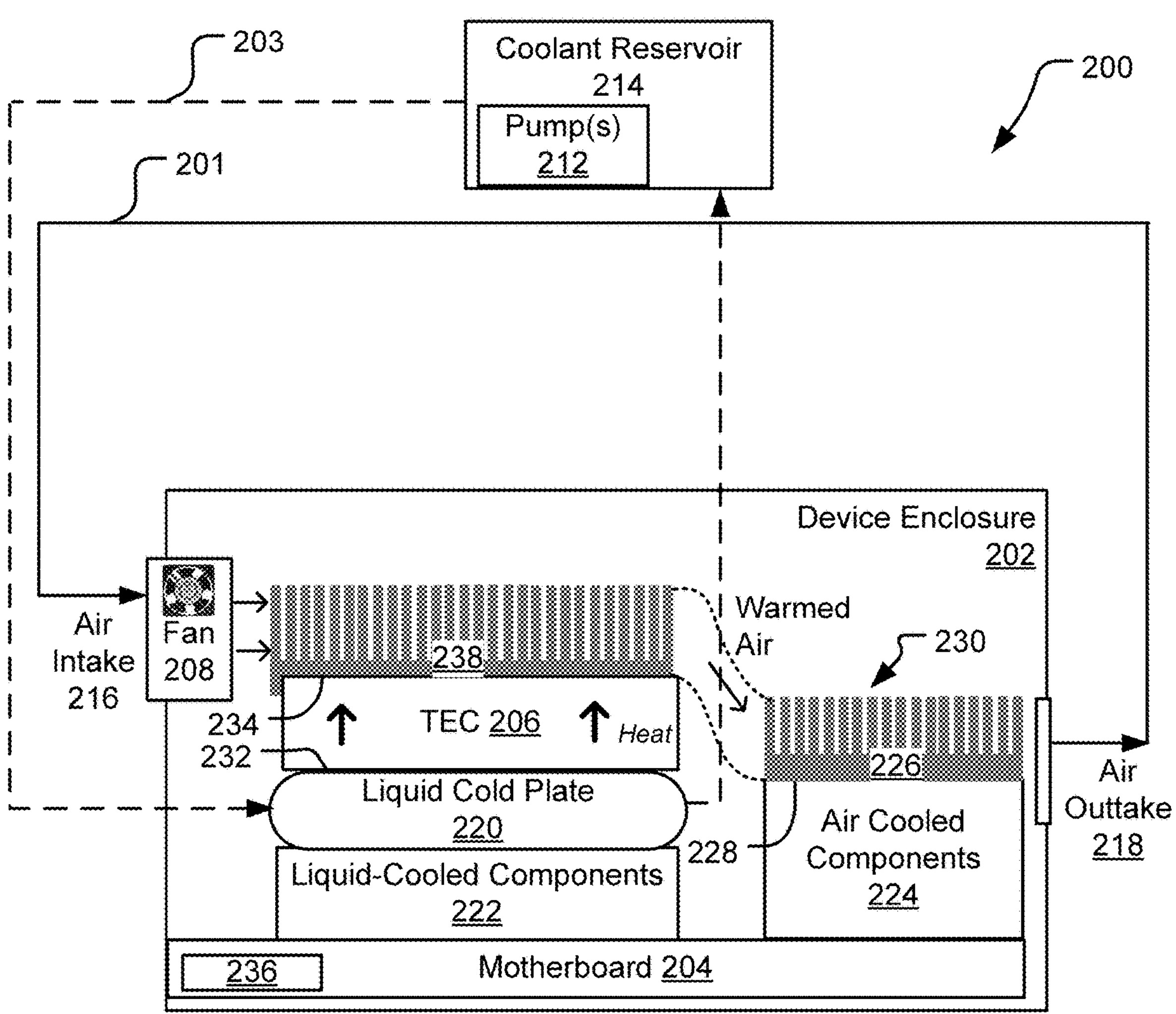
FIG. 2A illustrates an example computing device includes a cooling system with a TEC that provides selective heat transfer between different coolant loops.

FIG. 2A illustrates an example computing device 200 includes a cooling system with a thermoelectric cooler (TEC 206) that provides selective heat transfer between different coolant loops. The computing device 200 includes a device housing 202 that encloses a motherboard 204. The motherboard 204 supports electrical connections that provide power to various heat-generating electronic components. By design, a first subset of the heat-generating components are cooled by air that is circulated, by a fan 208, through a first coolant loop 201 that passes through the of the computing device 200 (e.g., between an air intake 216 and an air outtake 218). This coolant loop is referred to below as the "air-cooled loop."

Another subset of the heat-generating components within the computing device 200 are cooled by liquid coolant that is circulated through a second coolant loop 203 of the computing device 200 by one or more pumps 212. This coolant loop is referred to in the below as the "liquid-cooled loop." The pump(s) 212 of the liquid-cooled loop reside in a coolant reservoir 214, which can be understood as including one or multiple interconnected tanks filled with liquid coolant that is circulated, by the pump(s) 212 through a network of channels, at least some of which pass through the computing device 200. In some data centers, various different servers have coolant inlets and outlets coupled to external channels (pipes) that connect to a common coolant reservoir (e.g., the coolant reservoir 214) such that the coolant residing in the coolant reservoir 214 is circulated through multiple servers.

In FIG. 2A, the coolant reservoir 214 is shown to be external to the computing device 200; however, it is to be understood that device 200 is, in at least some implementations, immersed in the coolant reservoir 214. For example, the computing device 200 is one server in a rack of servers immersed within a cooling tank that includes one or more pumps for circulating the coolant of the tank coolant through various channels passing through each of the servers.

In one implementation, the cooling media in each of the first coolant loop 201 is maintained within a first target temperature range and the cooling media in the second coolant loop 203 is maintained within a different target temperature range. These temperature ranges are selected based on the heat generation patterns and cooling needs of various components that are cooled by these different coolant loops.

The computing device 200 includes a bank of air-cooled components 224 thermally coupled to (e.g., in contact with) an air-cooled heat sink 226 positioned in-line with the flow of air through the first cooling loop 201. The air-cooled heat sink 226 has a first side 228 that receives heat generated by the air-cooled components 224. This heat is distributed from the first side 228 over a comparatively large surface area of multiple fins 230. The fins 230 are in-line with the first coolant loop 201 such that air flowing through the first coolant loop 201 flows through channels formed by the fins 230. This substantial contact surface area between the fins 230 and the air allows the heat to be transferred to the air and carried to the air outtake 218.

Notably, a temperature of the air-cooled components 224 can be actively controlled by increasing or decreasing power provided to the fan 208 which, in turn, effects a proportional increase or decrease in the flow of the air through the first coolant loop 201, carrying proportionally more or less heat away from the air-cooled components 224.

The computing device 200 additionally includes a bank of liquid-cooled components 222 that are in contact with a liquid cold plate 220 in-line with the second coolant loop 203. When liquid coolant is circulating throughout the second coolant loop 203, heat generated by the liquid-cooled components 222 is transferred to the liquid coolant as it passes through the liquid cold plate 220 and carried away to the coolant reservoir 214. Notably, a temperature of the liquid-cooled components 222 can be actively controlled by increasing or decreasing power provided to the pump(s) 212 which, in turn, effects a proportional increase or decrease in the flow of the liquid coolant through the second coolant loop 203, carrying proportionally more or less heat away from the liquid-cooled components 222.

The TEC 206 is an electrically-driven component selectively powerable to transfer heat between the second coolant loop 203 and the first coolant loop 201. A first side 232 of the TEC 206 is thermally coupled to the liquid cold plate 220 (e.g., via direct or indirect conductive contact) such that heat is conductively transferred between the liquid cold plate 220 and the first side 232 of the TEC 206. A second side 234 of the TEC 206 is thermally coupled to an air-cooled heat sink 238 shown to have features identical to those described with respect to the air-cooled heat sink 226. In other implementations, the air-cooled heat sink 238 is replaced with another heat transfer component with features that provide similar heat transfer functionality.

When the TEC 206 is turned off, the first coolant loop 201 and the second coolant loop 203 are substantially thermally independent of one another. However, when the TEC 206 is powered on and configured in a first heat transfer mode (as shown by direction of arrows within the TEC 206 in FIG. 2A), heat is pulled away from the first coolant loop 201 at the first side 232 of the TEC 206 and transferred to the second side 234. This heat accumulating the second side 234 of the TEC 206 is transferred to the air-cooled heat sink 238 which, in turn, transfers the heat to the air flowing through the first coolant loop 201. As shown, warmed air leaving the air-cooled heat sink 238 is then directed through the air-cooled heat sink 226 before leaving the device at the air outtake 218.

The illustrated selective operation of the TEC 206 in the first heat transfer mode (e.g., supporting heat transfer from the first side 232 to the second side 234) can be leveraged in various scenarios to satisfy a defined performance objective for the device. For example, control electronics 236 execute logic for selectively toggling the TEC 206 on and off to satisfy a performance objective.

In one implementation, the computing device 200 is a server included in a cluster of server used to perform large-scale AI training operations. The liquid-cooled components 222 include one or more banks of GPUs that cycle on in tandem during each cycle of model training (e.g., where the model receives inputs, computes a loss function, and then adjusts weights). At the conclusion of each training cycling, the GPUs cycle off in tandum. This GPU on/off cycling can occur many times in a single second, thereby oscillating total device power demand from a near-zero power consumption state to a near-max power consumption state multiple times in the same one-second interval. As described elsewhere herein, power utility providers refuse to support these extreme oscillations. Current solutions to this problem are component-expensive (e.g., relying on batteries or generators that wear off quickly due to the rapid cycling) or extremely wasteful in terms of power consumption (e.g., due to creation of dummy loads executed at off-peak times to smooth power oscillations). A less expensive and more power-efficient solution to this problem is to cycle the TEC 206 on at times when the liquid-cooled components 222 (e.g., banks of GPUs) are operating at off-peak power consumption, such as in the intervals between each training cycle in an AI training operation.

In one implementation addressing the foregoing power oscillation challenges, the control electronics 236 selectively power the TEC 206 on to transfer heat in the direction shown when a power consumption rate of the liquid-cooled components 222 (or of the entire device 200) is below a threshold. For example, the TEC 206 is powered on the GPUs are all turned off in tandem and powered off when the GPUs are all turned on in tandem. In one implementation, this selective on/off powering of the TEC 206 and is performed based on active monitoring of power consumption for the computing device 200 and/or for the liquid-cooled components 222, such as by control electronics 236 included within the motherboard 204 or a separate baseboard management controller (BMC) coupled to the motherboard 204. For example, the BMC turns the TEC 206 on when the total power consumption of the device 200 drops below a predefined threshold and the BMC turns the TEC 206 off when the total power consumption of the computing device 200 rises above the threshold.

As will be realized from further discussion below, this on-demand capability for selectively transferring heat transfer between coolant loops also facilitates a down-sizing of the respective coolant loops (e.g., reducing the cooling capacity of each loop when operated thermally independent of the other loop), saving on component costs and component size.

Figure 2B:
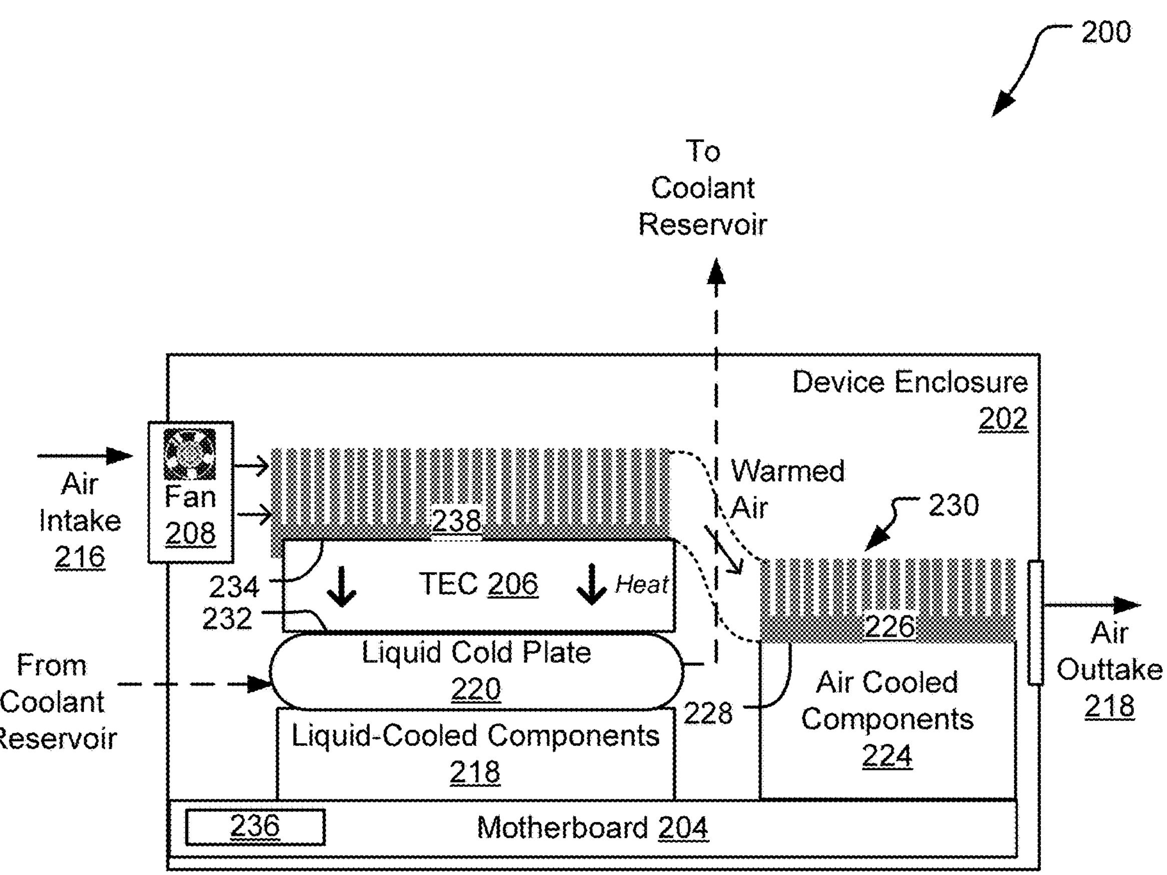
FIG. 2B illustrates another implementation of the computing device of FIG. 2A with the TEC being driving in an opposite direction of that shown in FIG. 2A.

FIG. 2B illustrates another implementation of the computing device 200 in which the TEC 206 is being driving in an opposite direction from that shown in FIG. 2A. In this implementation, the TEC 206 pulls heat away from the air-cooled heat sink 238 and transfers the heat to the liquid cold plate 220 (e.g., heat is transferred from the second side 234 to the first side 232).

In one implementation, the computing device 200 includes control electronics (e.g., the control electronics 236) that selectively toggle the TEC 206 back and forth between the first heat transfer mode shown in FIG. 2A and the second heat transfer mode shown in FIG. 2B. For example, the control electronics 236 monitor temperature and/or power states of the computing device 200 and toggle the heat transfer mode when the monitored state(s) satisfy various predefined criteria.

In one implementation, the control electronics 236 monitor a temperature differential between the different coolant loops and selectively alter the heat transfer mode of the TEC 206 when the temperature differential exceeds a threshold, such as to selectively transfer heat from the hotter of the two coolant loops to the colder of the two loops. This logic can be employed to reduce or mitigate a total net energy consumed by the multi-loop cooling system of the device 200. If, for example, the liquid-cooled components are running especially hot at times when air-cooled components are cool (idle), it may be more energy efficient to move some of the heat from the liquid-cooled loop to the air-cooled loop (e.g., per the heat transfer mode shown in FIG. 2A) than to provide the same degree of cooling by increasing power to components of the liquid-cooled loop (e.g., the liquid coolant pumps and/or chillers). Alternatively, if the air-cooled components are running especially hot at times when the liquid-cooled components are near the lower end of their nominal operational temperature range, the same type of energy savings can be realized by utilizing the TEC 206 to transfer heat from the air-cooled loop to the liquid-cooled loop (e.g., per the second heat transfer mode shown in FIG. 2B).

In still another implementation, the control electronic 236 execute logic that provides for selectively transferring heat back and forth between the coolant loops as needed to maintain one or more components of the device (e.g., in one or both coolant loops) within a corresponding manufacturer-designated optimal temperature range, such as a range identified as being likely to maximize the performance and/or lifetime of the component.

Figure 3:
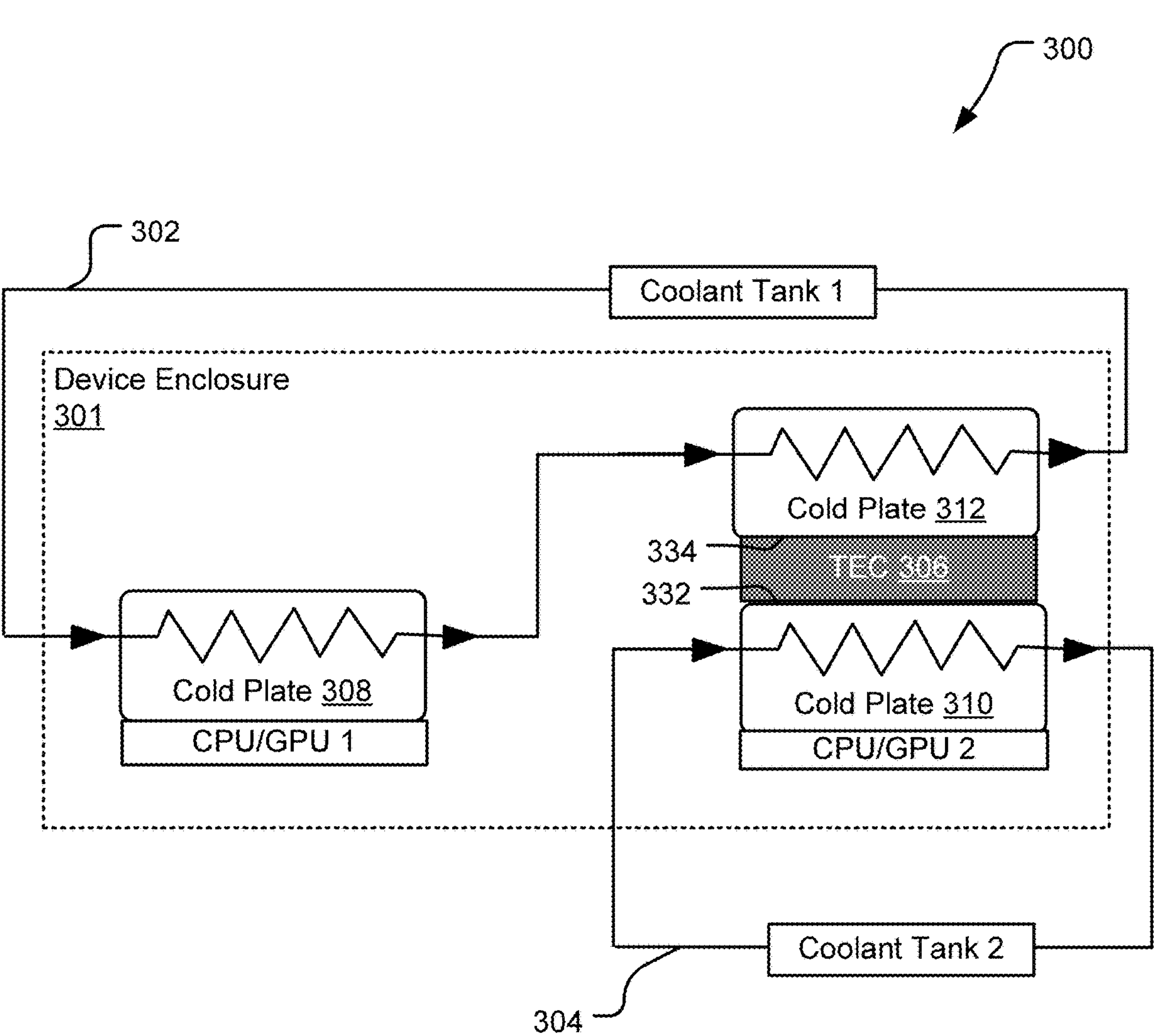
FIG. 3 illustrates still another example cooling system with a TEC that provides heat transfer between different coolant loops within a device enclosure.

FIG. 3 illustrates still another example cooling system 300 with a thermoelectric cooler (TEC 306) that provides heat transfer between different coolant loops within a device enclosure 301. The cooling system 300 includes a first coolant loop 302 circulating a first cooling media and a second coolant loop 304 circulating a second coolant media. In the cooling system 300, the first cooling media and the second cooling media are both liquid coolant.; however, different types of liquid coolant may be used in the two loops and/or the two different loops may be maintained within different operational temperature ranges.

In the cooling system 300, the first coolant loop 302 carries the first cooling media to and from a first coolant tank ("coolant tank 1") and also delivers the first cooling media to a first cold plate 308, which provides cooling to a first component bank (e.g., "CPU/GPU 1"). The second coolant loop 304 carries the second cooling media to and from a second coolant tank ("coolant tank 2") and delivers the second cooling media to a second cold plate 310, which provides cooling to a second component bank (e.g., "CPU/GPU 2").

The TEC 306 has a first side 332 thermally coupled to the second cold plate 310 and a second opposite side 334 thermally coupled to a third cold plate 312 that is in-line with the first coolant loop 302. When the TEC 306 is powered of, the first coolant loop 302 and the second coolant loop 304 operate substantially thermally independent of one another. When the TEC 306 is powered on in a first heat transfer mode, the TEC 306 pulls heat from the second cold plate 310 and transfers the heat to the third cold plate 312, effectively transferring heat from the second coolant loop 304 to the first coolant loop 302. When, in contrast, the TEC is powered on in a second heat transfer mode, the direction of heat transfer is reversed and the TEC 306 pulls heat from the third cold plate 312 and transfers the heat to the second cold plate 310, effectively transferring heat from the first coolant loop 302 to the second coolant loop 304

In various implementations, the power to the TEC 306 is selectively metered (on/off) at carefully chosen times and/or the heat transfer mode is selectively altered to achieve a performance objective consistent with any of the herein-described performance objectives.

Figure 4:
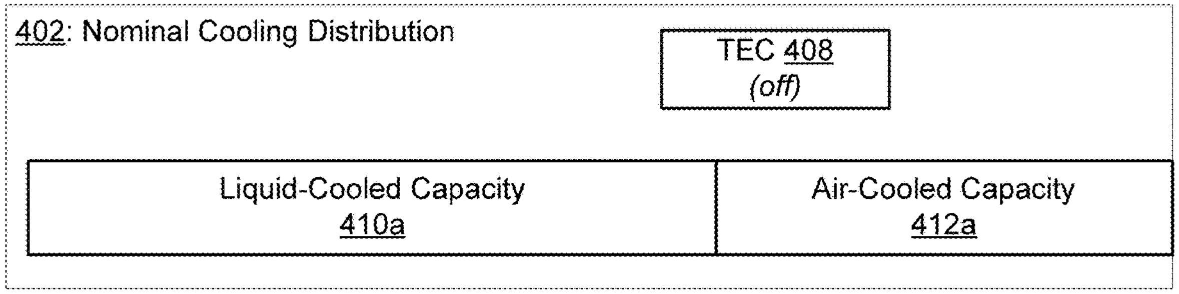
FIG. 4 includes example diagrams illustrating how cooling capacity is shifted between different coolant loops in a device cooling system when a TEC is selectively powered on and driven in different modes of heat transfer.
Figure 4:
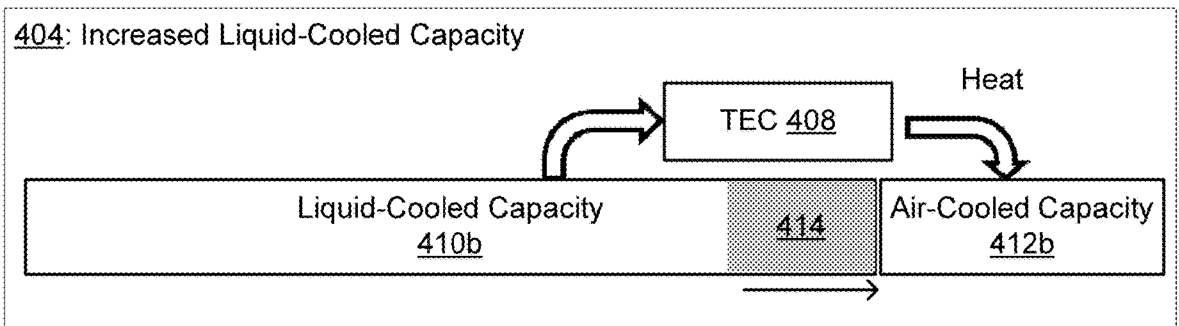
Figure 4:
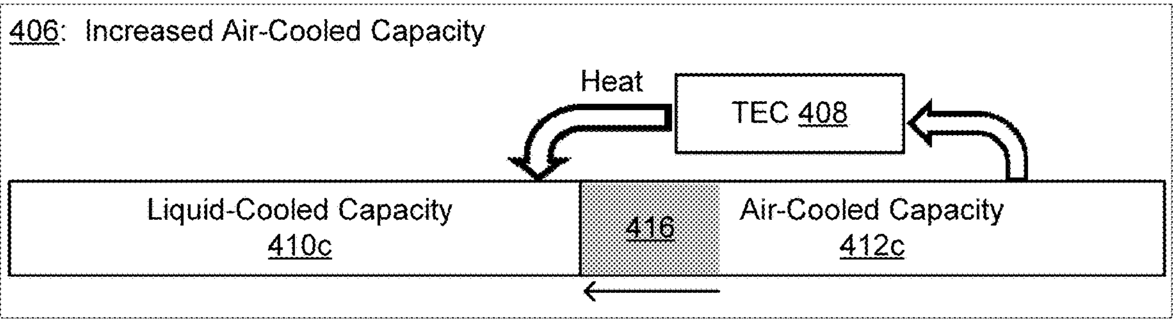

FIG. 4 includes example diagrams 402, 404, and 406 illustrating how cooling capacity is shifted between different coolant loops in a device cooling system when a TEC 408 is selectively powered on and off and driven in different modes of heat transfer. Specifically, the example diagrams 402, 404, and 406 illustrate cooling distributions achieved during three different modes of TEC operation for a device cooling system. Consistent with other implementations disclosed herein, the device cooling system includes two different coolant loops and a TEC 408 positioned to selectively transfer heat between the two coolant loops.

In the example shown, the cooling system includes a liquid-cooled loop and an air-cooled loop (e.g., as shown in any of FIGS. 1 and 2A-2B). Relative cooling capacities of the liquid-cooled loop and the air-cooled loop are represented by the relative sizes of boxes labeled "liquid-cooled capacity" (410*a*, 410*b*, and 410*c*) and "air-cooled capacity" (412*a*, 412*b*, and 412*c*) within each of the respective diagrams 402, 404, and 406. Notably, the numerals a, b, c (appended to labels 410 and 412) are intended to represent respective different points in time such that 410*a*, 410*b*, and 410*c* represent the liquid-cooled capacity of the liquid cooled loop at three points in time (and modes of operation) while 412*a*, 412*b*, and 412*c* likewise represent the air-cooled capacity of the air-cooled loop at that same respective three points in time.

Cooling capacity refers to a maximal amount of cooling (in Watts) that a system can provide. Air-cooled capacity refers to the maximal amount of cooling that an air-cooled loop can provide while liquid-cooled capacity refers to the maximal amount of cooling that a liquid-cooled loop can provide. When the device cooling system represented in FIG. 4 is operating in a steady state, heat generated by air-cooled components of a device is the same as the heat removed by the air-cooled loop of the device, and heat generated by liquid-cooled components of the device is the same as the heat removed by the liquid-cooled loop.

The first diagram 402 illustrates a nominal cooling distribution that is observed when the TEC 408 is powered off. Notably, the liquid-cooled capacity 410 and the air-cooled capacity 412 depend upon the size and maximum power of active cooling components as well as the cooling capacities of the respective cooling media. In the example shown, the liquid-cooled capacity 410 is illustrated as being slightly larger than the air-cooled capacity 412 (such as a 60/40 split of total system cooling capacity). While it is not necessarily true that a device with liquid and air-cooled components will always have a greater liquid-cooling capacity that air-cooling capacity, liquid coolant does provide more efficient cooling and a liquid-cooled loop therefore has the capacity to carry away more heat than an air-cooled loop of similar size and flow rate.

The second diagram 404 illustrates a first shift in the nominal cooling distribution of the first diagram 402 that is observed when the TEC 408 is powered on in a first heat transfer mode that transfers heat from the liquid-cooled loop to the air-cooled loop (e.g., consistent with the heat transfer mode shown in FIG. 2A). In this operational mode, the transfer of heat out of the liquid-cooled loop decreases the temperature of the circulating liquid coolant without a change in power to the components of the liquid-cooled loop (e.g., the pump(s) that circulate the coolant or chillers that remove heat from the liquid coolant). This drop in temperature is reflected in the diagram 404 by the increased size of the liquid-cooled capacity 410*b* as compared to the liquid-cooled capacity 410*a* in the nominal cooling distribution of the first diagram 402, with the difference being represented by a first shaded area 414. The heat pulled away from the liquid cooled loop is dumped into the air-cooled loop, warming the air that is in circulation. Consequently, the cooling capacity of the air-cooled loop is decreased, as shown. In a system that utilizes liquid cooling for GPUs and air-cooling for CPUs, this operational mode is invoked to provide better GPU cooling when GPU load is high relative to CPU load (e.g., when the air-cooled capacity can be decreased as shown without dropping temperature of the circulating air outside of an associated target air temperature range).

The third diagram 406 illustrates a second shift in the nominal cooling distribution of the first diagram 402 that is observed when the TEC 408 is powered on in a second heat transfer mode that transfers heat from the air-cooled loop to the liquid-cooled loop (e.g., consistent with the heat transfer mode shown in FIG. 2B). In this operational mode, the transfer of heat out of the air-cooled loop causes the temperature of the circulating air to drop without changing fan speed. This drop in air temperature is reflected in the diagram 406 by the increased size of the air-cooled capacity 410*c* as compared to the air-cooled capacity 410*a* in the nominal cooling distribution of the first diagram 402, with the difference being shown by a second shaded area 416.

The heat pulled away from the air-cooled loop is dumped into the loop-cooled loop, warming the liquid coolant that is in circulation. Consequently, the cooling capacity of the liquid-cooled loop is decreased, as shown. In a system that utilizes liquid cooling for GPUs and air-cooling for CPUs, this operational mode is optionally invoked to provide better CPU cooling when CPU load is high relative to GPU load (e.g., when the liquid-cooled capacity can be decreased as shown without dropping temperature of the circulating liquid outside of an associated target liquid temperature range).

Figure 5:
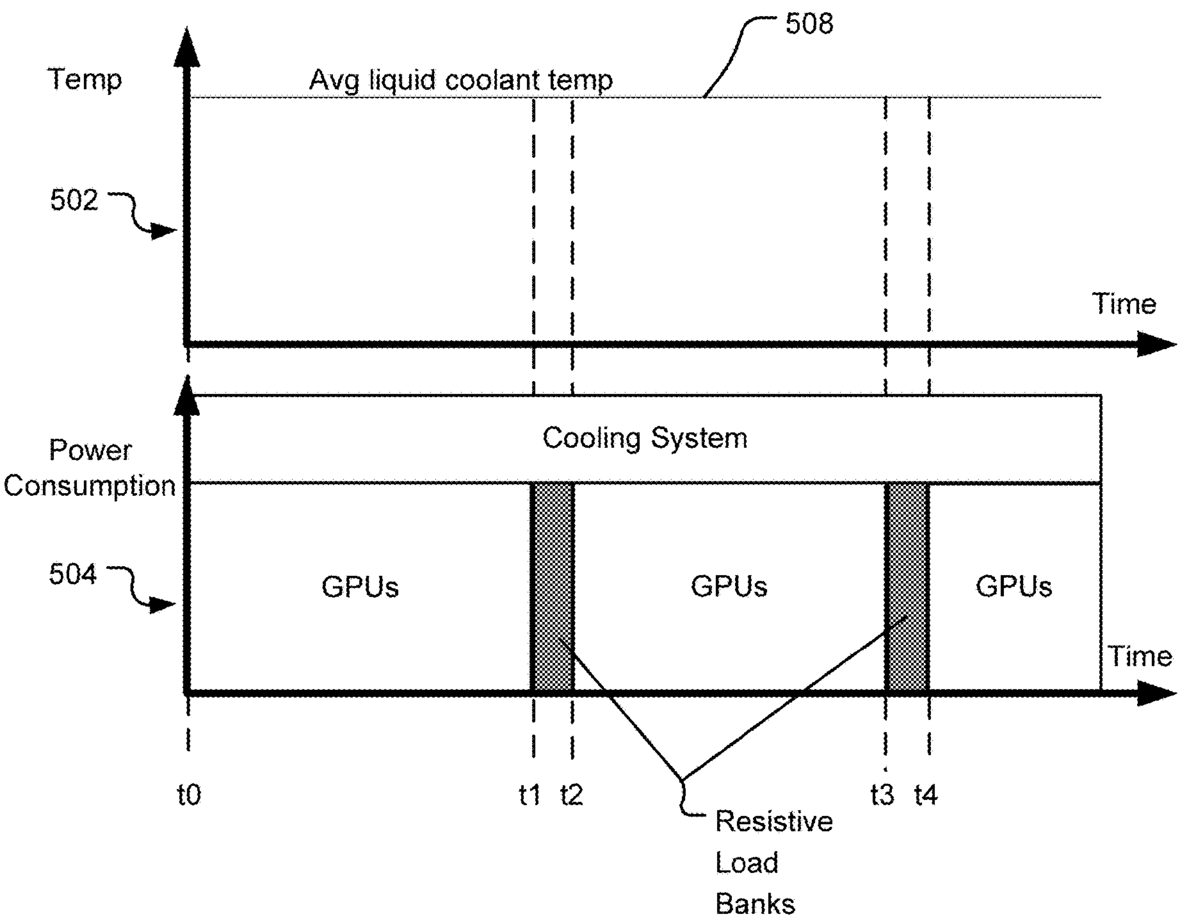
FIG. 5 includes plots illustrating example power and temperature trends observed in a server utilizing resistive load banks to mitigate the effect of extreme power oscillations otherwise observed during nominal device operations.
Figure 6:
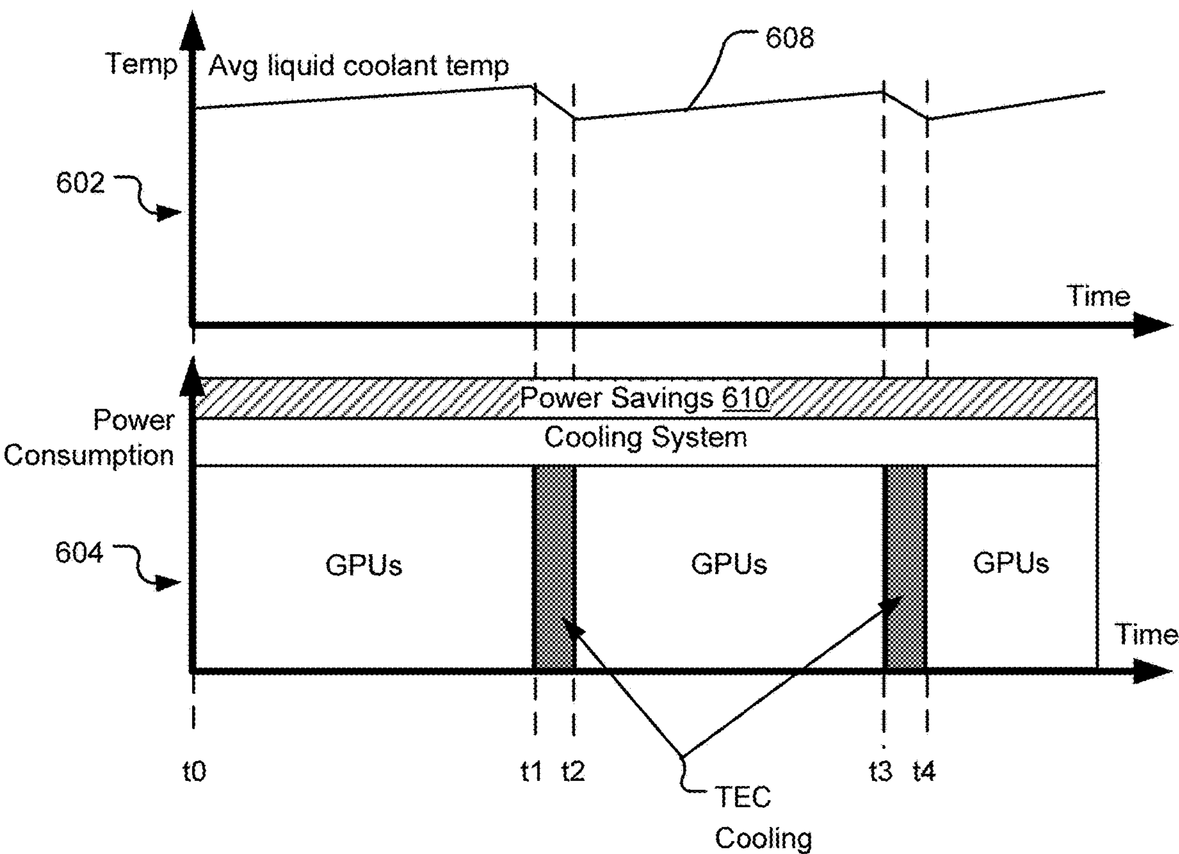
FIG. 6 includes plots illustrating example power and temperature trends observed in a server implementing the disclosed selective TEC cooling technology.

FIGS. 5 and 6 illustrate various power and temperature trends observed in a server used to perform distributed computations of large-scale AI training operations. As described elsewhere herein, these large-scale AI training operations cause rapid cycling of GPU banks in many servers at once. This rapid GPU cycling is characterized by extreme power oscillations at the data center level, impermissibly straining the power grid and motivating the search for ways to mitigate these oscillations.

FIG. 5 includes plots 502, 504 illustrating example power and temperature trends observed in a server utilizing resistive load banks to mitigate the effect of extreme power oscillations otherwise observed during nominal server operations. The trends reflected in the plots 502, 504 are observed in a server that does not utilize the herein-disclosed TEC selective heat transfer technology. Instead, the server of FIG. 5 solves the herein-described power oscillation problem by creating "dummy loads" to draw additional energy from the grid at times when GPU banks are quiet (e.g., between each AI training cycle) by selectively turning on resistive load banks that convert electrical energy into heat, thereby increasing power consumption when the device would otherwise be experiencing at or near minimum power consumption.

The plot 504 is a power-time plot that illustrates net power consumption on the y-axis that is attributable to cooling system operations combined with the power consumption of GPUs and resistive load banks. During server operation, the server's GPUs are cycled on between t0 and t1, t2 and t3, and t4 and t5. When the GPUs are idle (between t1 and t2 and between t3 and t4), resistive load banks are powered on and consume approximately the same power at during the GPU-idle times as the GPUs consume during the GPU-active times. Since the restive load banks generate substantially the same quantity of heat at the GPU-idle times as the GPUs do at the GPU-active times, the power consumption attributable to cooling operations (block labeled "Cooling System") remains substantially constant throughout the entire time interval t0 to t5.

The plot 502 is a temperature-time plot and includes a first line 508 representing temperature of the liquid coolant circulating through the liquid-cooled loop that provides cooling to both the GPUs and the resistive load banks. In this implementation, there is no heat transfer between the air-cooled loop and the liquid-cooled loop, and the liquid cooling system is controlled independently to ensure that the liquid coolant temperature remains substantially constant throughout the GPU cycling operations.

FIG. 6 includes plots 602, 604 illustrating example power and temperature trends observed in a server implementing the disclosed selective TEC cooling technology. The server includes a TEC that couples the server's air-cooled loop to the server's liquid-cooled loop and the TEC is configured to transfer heat from the liquid-cooled loop to the air-cooled loop, such as in a manner consistent with that described above with respect to FIG. 2A. In the illustrated implementation, the TEC is selectively powered off at times when the server's GPUs are active and the TEC is selectively powered on at times when the GPUs are idle.

The power trend plot 604 illustrates that selectively powering the TEC on at GPU-idle times provides a power oscillation mitigation effect the same or similar to that achieved by selectively powering resistive load banks (as discussed with respect to FIG. 5). That is, power oscillations are not observed because the TEC consumes substantially the same amount of power at the GPU-idle times as the GPUs do at the GPU-active times. Interestingly, however, the cooling system in FIG. 6 experiences a net decrease 610 in power consumption as compared to the system of FIG. 5. This power savings is attributable to the fact that the TEC advantageously provides cooling to the GPUs while the resistive load banks generate heat that needs to be removed by the cooling system (without any system benefit aside from power oscillation mitigation).

As shown in the plot 602, the average liquid coolant temperature 608 experiences a dip each time the TEC is powered on (e.g., from t1 to t2 and again from t3 to t5), due to the fact that the TEC is pulling heat from the liquid-cooled loop (reducing the coolant temperature) and dumping this heat into the air-cooled loop. Also, since the TEC is powered on for brief intervals representing a small fraction of total server operation, the additional heat does not substantially affect the air-cooling capacity of the system.

Figure 7:
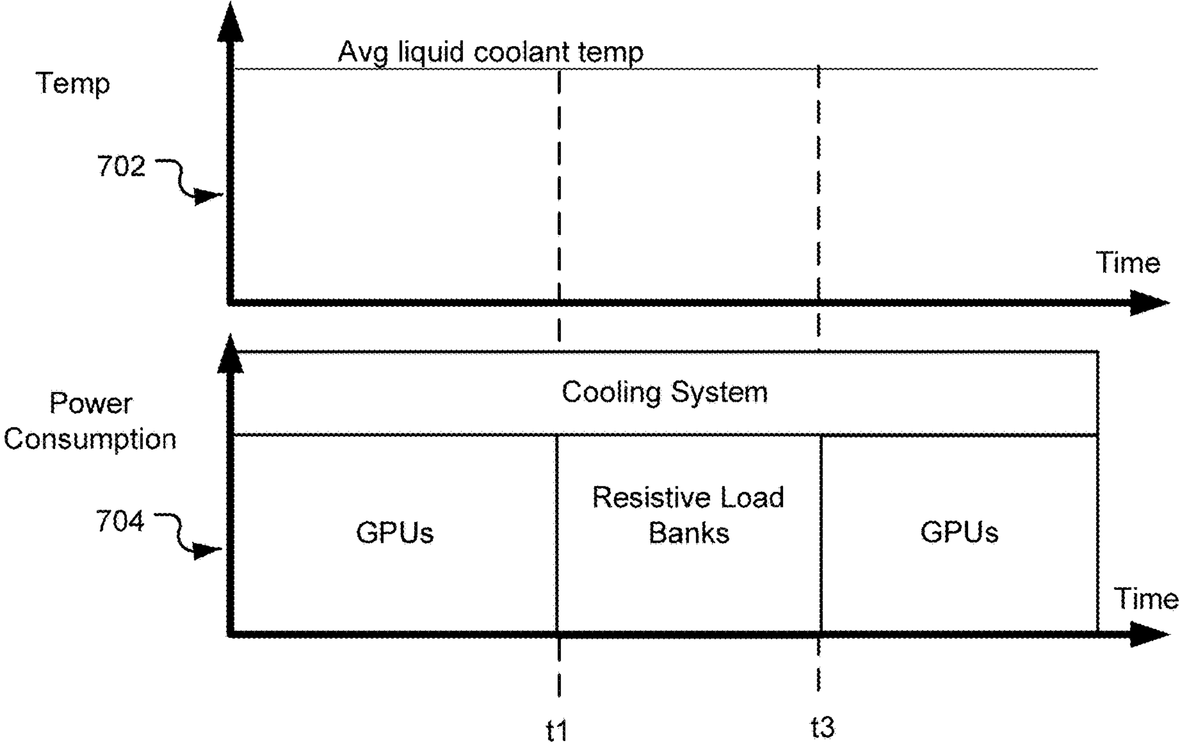
FIG. 7 illustrates an additional example temperature and power trends observed in a server implementing the resistive load bank solution discussed with respect to FIG. 5 throughout a longer-duration GPU idle period.

FIG. 7 illustrates an additional example temperature and power trends observed in a server implementing the resistive load bank solution (e.g., as discussed with respect to FIG. 5) throughout a longer-duration GPU idle period than the GPU idle periods shown and discussed with respect to FIGS. 5 and 6. Specifically, FIG. 7 illustrates a temperature trend plot 702 and power consumption plot 704 for a server that implements resistive load banks to mitigate power oscillations and that has the same or substantially similar characteristics as the server discussed with respect to FIG. 5. In FIG. 7, however, the trend plots span a long-term GPU idle period between t1 and t4. As shown, the cooling system power consumption remains substantially constant throughout this interval.

Figure 8:
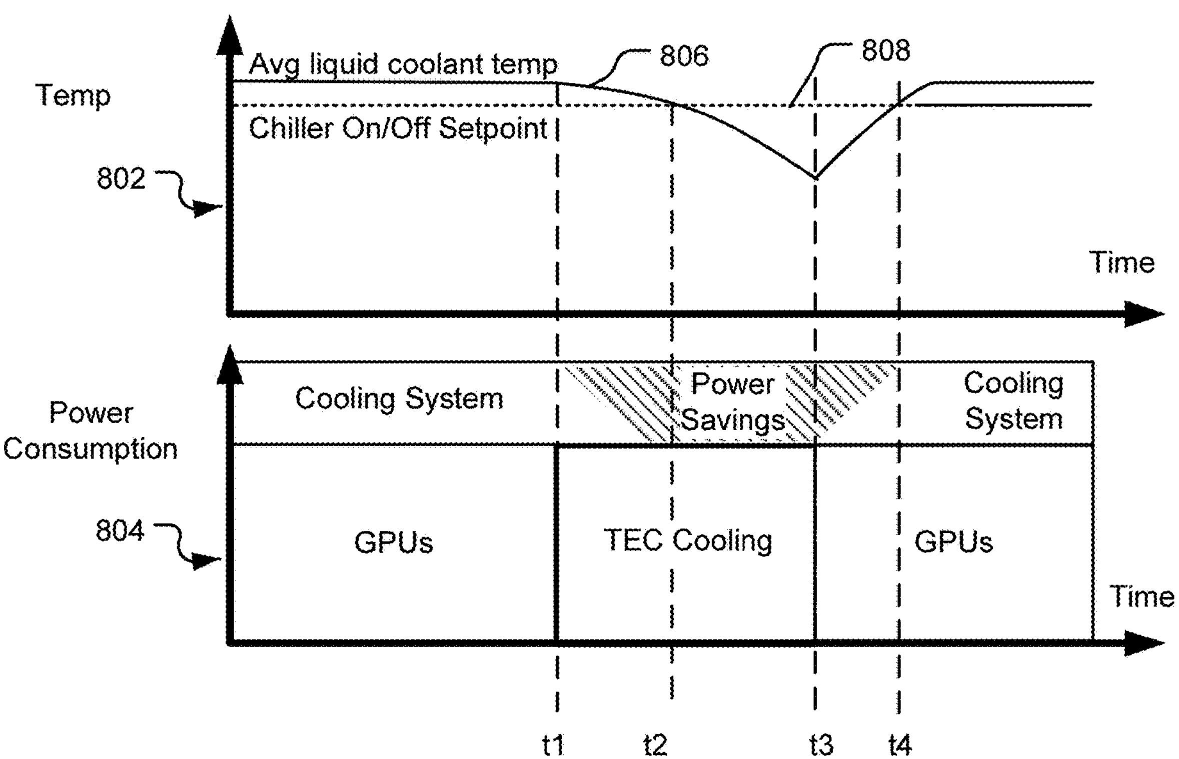
FIG. 8 illustrates example temperature and power trends observed in a server implementing the disclosed selective TEC cooling techniques throughout a long-duration GPU idle period.

FIG. 8 illustrates example temperature and power trends observed in a server implementing the disclosed selective TEC cooling techniques throughout a time interval that includes a long-duration GPU idle period similar to that shown in FIG. 7. Specifically, FIG. 8 illustrates a temperature plot 802 and power consumption plot 804 (e.g., power consumption trend plot 804 and temperature trend plot 802) in a server that implements selective TEC cooling and that has the same or substantially similar characteristics as the server discussed with respect to FIG. 6 and/or FIG. 2A. The power consumption trend plot 804 and temperature trend plot 802 illustrate how selective TEC cooling yields a dramatic power savings when implemented during an extended period of GPU inactivity in a server. The time elapsed between t1 and t4 is assumed to correspond to the same time elapsed between t1 and t4 of FIG. 7 (e.g., in the server implementing the resistive load bank solution over a time period characterized by the same periods of GPU activity and inactivity).

Referring to the temperature trend plot 802, a temperature line 806 illustrates the average liquid coolant temperature over time. This temperature begins to decrease when the TEC cooling begins at time t1. After a period of time (e.g., at t2), the coolant temperature drops below the on/off setpoint 808 of chillers used by the liquid-coolant loop to remove heat from the liquid coolant (e.g., via vapor-compression, absorption refrigeration, or absorption refrigeration cycles). At this point it time, the liquid-cooling system consumes little to no power at all. Consequently, significant power savings is realized between times T2 and T3 while the TEC is powered on. At time T3, the TEC is powered off as the GPUs cycle back on. In this scenario, the cooling system continues to benefit from a net power savings well into the next GPU cycle (e.g., all the way until time t4, when the liquid coolant temperature heats up to the on/off setpoint 808 and the chillers power on).

As shown collectively by FIG. 5-8, selective TEC cooling presents a more power-efficient way of mitigating or eliminating extreme power oscillations that resistive load banks.

Figure 9:
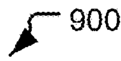
FIG. 9 illustrates example logical operations for selectively driving a TEC within a device to satisfy a cooling system performance objective.
Figure 9:
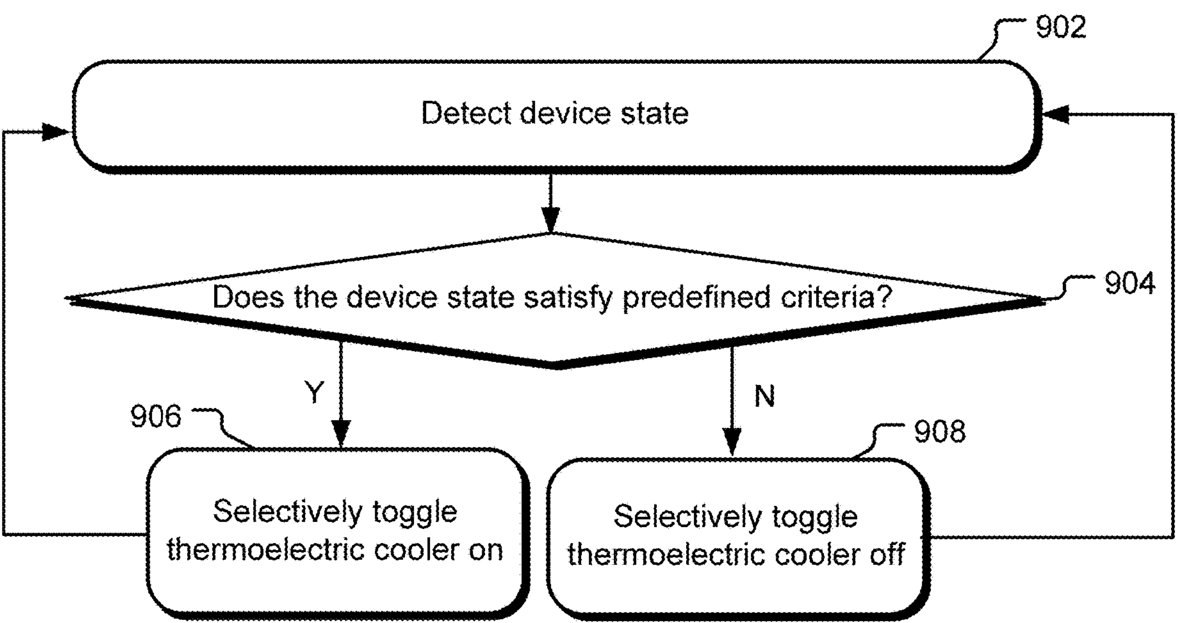

FIG. 9 illustrates example logical operations 900 for selectively driving a TEC within a device to satisfy a cooling system performance objective. A device state detection operation 902 determines (e.g., by measurement, lookup, or calculation) information descriptive of a current device state, such as information pertaining to current device temperature(s) and/or power consumption metrics as in the examples provided below.

A determining operation 904 determines whether the current device state satisfies predefined criteria, which is defined herein to mean either one criterion or multiple criteria. For example, the determining operation determines whether a detected component temperature exceeds a threshold, whether a temperature differential between coolant loops exceeds a threshold, or whether a current power consumption rate of the device exceeds one or more thresholds.

In response to determining that the device state does satisfy the predefined criteria, a first toggling operation selectively toggles a thermoelectric cooler into an "on" state. The TEC is positioned within the device and configured to transfer heat between a first coolant loop circulating a first cooling media and a second coolant loop circulating a second cooling media. When the TEC is turned on, the TEC begins transferring heat according to a first heat transfer mode. For example, the first heat transfer mode transfers heat from the first cooling media to the second cooling media.

The device state detection operation 902 is repeated at multiple sampling intervals and, the determination operation 904 is repeated in response to each instance of the device state detection operation 902. When the determining operation 904 determines that the device state no longer satisfies the predefined criteria, a second selective toggling operation 908 selectively toggles the thermoelectric cooler from the "on" state to the "off state."

In one implementation, the cooling system performance objective is to mitigate extreme power oscillations (e.g., oscillations in excess of a defined magnitude) within the device. In this implementation, the device state detection operation 902 samples a power consumption rate of the device. For example, a server BMC of the server provides a current or recent power consumption rate (e.g., over a recent interval). In one implementation, the power consumption rate satisfies the predefined criteria when the sampled power rate is below a defined threshold, such as a threshold characteristic of a GPU and/or CPU idle/quiet period. For example, the system described above with respect to FIG. 6 enables TEC cooling at times when the GPU banks in a server are idle. In this scenario, TEC cooling is enabled at the start of the GPU-idle time (e.g., when the power consumption rate drops below a threshold) and TEC cooling continues until the GPUs cycle on again (e.g., when the power consumption rate drops back above the threshold).

In another implementation, the cooling system performance objective is to ensure that a device component temperature remains within a defined temperature range, such as a range designated by a component manufacturer as one likely to extend the lifetime of the component and/or improve the component's performance (e.g., reliability). In this case, the device state detection operation 902 detects a temperature associated with the component (e.g., a temperature near the component and/or of a coolant that is exiting a region that provides cooling to the component). The determining operation 904 determines that the predefined criterion is satisfied when the temperature exceeds a threshold, and the first toggling operation 906 powers on the TEC in a heat transfer mode that removes heat from the coolant loop that provides cooling to the component. When the temperature sampled by the device state detection operation 902 drops below the same or another threshold (e.g., when the component is again within the target temperature range), the second selective toggling operation 908 powers the TEC off.

In still another implementation, the cooling system performance objective seeks to minimize total energy consumed by the cooling system by balancing heat between different coolant loops. In this system, TEC heat transfer between coolant loops is favored over other cooling mechanisms (e.g., fans, chillers, pumps) whenever loop-to-loop heat transfer can be employed to achieve a desired degree of cooling in one of the coolant loops while still keeping the other coolant loop within its respective designated target operational temperature range. For example, the first toggling operation 906 enables heat transfer from a first coolant loop to a second coolant loop in response to determining both that (1) a temperature of the first coolant loop has exceeded a threshold (e.g., is approaching a boundary of its target operational temperature range) and also determining that (2) a temperature of the second coolant loop is below an upper boundary below of its operational temperature range by at least a predefined margin such that that the desired cooling can be achieved without endangering components cooled by the second coolant loop.

In some implementations, the logical operations 900 include selectively toggling a direction of heat transfer when the detected device state satisfies other criteria. For example, heat transfer is enabled to transfer heat from a hotter one of the two coolant loops to a colder one of the two loops in response to determining that a temperature differential between the two loops exceeds a defined threshold; this directional heat transfer is halted when the temperature differential drops to within a predefined range, and the direction of the heat transfer is reversed when the coolant loop temperature differential decreases and/or shifts in the opposite direction by a predefined amount.

Figure 10:
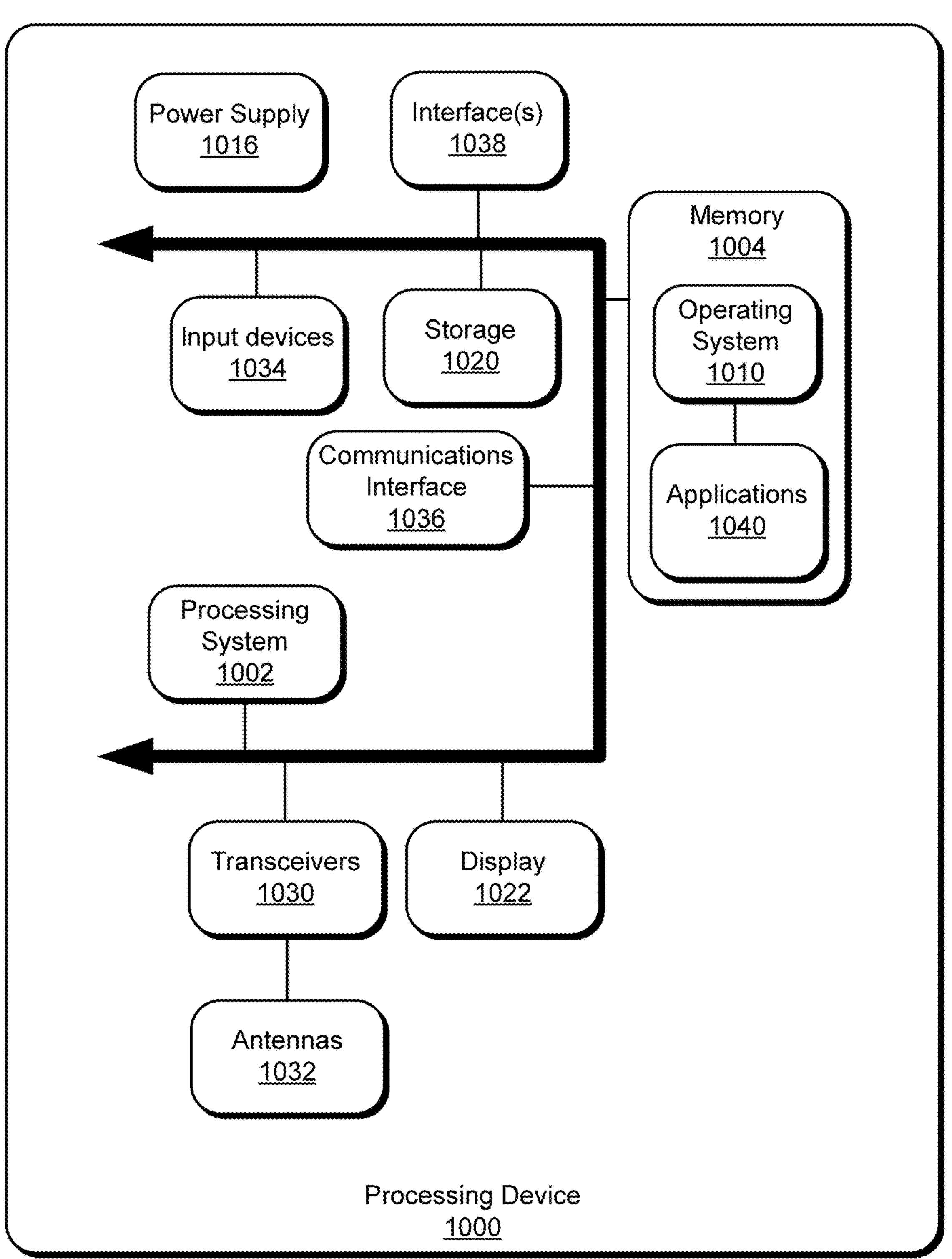
FIG. 10 illustrates an example schematic of a processing device suitable for implementing aspects of the disclosed technology.

FIG. 10 illustrates an example schematic of a processing device 1000 suitable for implementing aspects of the disclosed technology. The processing devices 1000 includes one or more processor unit(s) 1002, memory device(s) 1004, a display 1006, and other interfaces 1008 (e.g., buttons). The processor unit(s) 1002 may each include one or more CPUs, GPUs, etc.

The memory device(s) 1004 generally includes both volatile memory (e.g., RAM) and non-volatile memory (e.g., flash memory). An operating system 1010, such as the Microsoft Windows® operating system, the Microsoft Windows® Phone operating system or a specific operating system designed for a gaming device, may resides in the memory device(s) 1004 and be executed by the processor unit(s) 1002, although it should be understood that other operating systems may be employed.

One or more applications 1012 (e.g., control logic for selectively driving a TEC to satisfy a defined performance objective) are loaded in the memory device(s) 1004 and executed on the operating system 1010 by the processor unit(s) 1002. The applications 1012 may receive inputs from one another as well as from various input local devices such as a microphone 1034, input accessory 1035 (e.g., keypad, mouse, stylus, touchpad, gamepad, racing wheel, joystick), and a camera 1032. Additionally, the applications 1012 may receive input from one or more remote devices, such as remotely-located smart devices, by communicating with such devices over a wired or wireless network using more communication transceivers 1030 and an antenna 1038 to provide network connectivity (e.g., a mobile phone network, Wi-Fi®, Bluetooth®). The processing device 1000 may also include one or more storage devices 1028 (e.g., non-volatile storage). Other configurations may also be employed.

The processing device 1000 further includes a power supply 1016, which is powered by one or more batteries or other power sources and which provides power to other components of the processing device 1000. The power supply 1016 may also be connected to an external power source (not shown) that overrides or recharges the built-in batteries or other power sources.

The processing device 1000 may include a variety of tangible computer-readable storage media and intangible computer-readable communication signals. Tangible computer-readable storage can be embodied by any available media that can be accessed by the processing device 1000 and includes both volatile and nonvolatile storage media, removable and non-removable storage media. Tangible computer-readable storage media excludes intangible and transitory communications signals and includes volatile and nonvolatile, removable and non-removable storage media implemented in any method or technology for storage of information such as computer readable instructions, data structures, program modules or other data. Tangible computer-readable storage media includes RAM, ROM, EEPROM, flash memory or other memory technology, CDROM, digital versatile disks (DVD) or other optical disk storage, magnetic cassettes, magnetic tape, magnetic disk storage or other magnetic storage devices, or any other tangible medium which can be used to store the desired information, and which can be accessed by the processing device 1000. In contrast to tangible computer-readable storage media, intangible computer-readable communication signals may embody computer readable instructions, data structures, program modules or other data resident in a modulated data signal, such as a carrier wave or other signal transport mechanism. The term "modulated data signal" means a signal that has one or more of its characteristics set or changed in such a manner as to encode information in the signal. By way of example, intangible communication signals include wired media such as a wired network or direct-wired connection, and wireless media such as acoustic, RF, infrared and other wireless media.

Some implementations may comprise an article of manufacture. An article of manufacture may comprise a tangible storage medium (a memory device) to store logic. Examples of a storage medium may include one or more types of processor-readable storage media capable of storing electronic data, including volatile memory or non-volatile memory, removable or non-removable memory, erasable or non-erasable memory, writeable or re-writeable memory, and so forth. Examples of the logic may include various software elements, such as software components, programs, applications, computer programs, application programs, system programs, machine programs, operating system software, middleware, firmware, software modules, routines, subroutines, operation segments, methods, procedures, software interfaces, application program interfaces (API), instruction sets, computing code, computer code, code segments, computer code segments, words, values, symbols, or any combination thereof. In one implementation, for example, an article of manufacture may store executable computer program instructions that, when executed by a computer, cause the computer to perform methods and/or operations in accordance with the described implementations. The executable computer program instructions may include any suitable type of code, such as source code, compiled code, interpreted code, executable code, static code, dynamic code, and the like. The executable computer program instructions may be implemented according to a predefined computer language, manner or syntax, for instructing a computer to perform a certain operation segment. The instructions may be implemented using any suitable high-level, low-level, object-oriented, visual, compiled and/or interpreted programming language.

In some aspects, the techniques described herein relate to a device cooling system including: a first coolant loop that circulates a first cooling media through a device; a second coolant loop that circulates a second cooling media through the device; a thermoelectric cooler (TEC) positioned between the first coolant loop and the second coolant loop; and control electronics configured to drive the TEC to transfer heat between the first coolant loop and the second coolant loop.

In some aspects, the techniques described herein relate to a device cooling system, wherein the first cooling media is air and the first coolant loop includes an air-cooled heat-sink thermally coupled to a first side of the TEC.

In some aspects, the techniques described herein relate to a device cooling system, wherein the second cooling media is a liquid coolant and the second coolant loop includes a cold plate thermally coupled to a second side of the TEC opposite the first side of the TEC.

In some aspects, the techniques described herein relate to a device cooling system, wherein the first coolant loop includes a first cold plate thermally coupled to a first side of the TEC and the second coolant loop includes a second cold plate thermally coupled to a second side of the TEC opposite the first side.

In some aspects, the techniques described herein relate to a device cooling system, wherein the control electronics are configured to selectively drive the TEC to satisfy a performance objective for the device.

In some aspects, the techniques described herein relate to a device cooling system, wherein the performance objective includes mitigating power oscillations and wherein the control electronics are configured to: selectively drive the TEC in a power on state at times when total power consumption of the device is below a predefined threshold; and selectively maintain the TEC in a power off state at times when total power consumption of the device is above the predefined threshold.

In some aspects, the techniques described herein relate to a device cooling system, wherein the performance objective includes minimizing total energy consumption of the device cooling system by selectively transferring heat between the first coolant loop and the second coolant loop.

In some aspects, the techniques described herein relate to a device cooling system, wherein the performance objective includes selectively transferring heat between the first coolant loop and the second coolant loop to maintain temperature of a heat-generating component of the device within a target temperature range.

In some aspects, the techniques described herein relate to a device cooling system, where the control electronics drive the TEC by selectively altering a direction of the heat transfer in response to: detecting that a temperature differential between the first cooling media and the second cooling media exceeds a predefined threshold.

In some aspects, the techniques described herein relate to a method for operating a cooling system in a device, the method including: selectively toggling a thermoelectric cooler (TEC) of the device from an off state to an on state in response to determining that a state of the device satisfies predefined criteria, the TEC being positioned to transfer heat between a first coolant loop circulating a first cooling media and a second coolant loop circulating a second cooling media; and selectively toggling the TEC from the on state to the off state in response to determining that the state of the device no longer satisfies the predefined criteria.

In some aspects, the techniques described herein relate to a method, wherein the first cooling media is air and the first coolant loop includes an air-cooled heat-sink thermally coupled to a first side of the TEC.

In some aspects, the techniques described herein relate to a method, wherein the second cooling media is a liquid coolant and the second coolant loop includes a cold plate thermally coupled to a second side of the TEC opposite the first side of the TEC.

In some aspects, the techniques described herein relate to a method, wherein the first coolant loop includes a first cold plate thermally coupled to a first side of the TEC and the second coolant loop includes a second cold plate thermally coupled to a second side of the TEC opposite the first side.

In some aspects, the techniques described herein relate to a method, wherein the method further includes selectively toggling the TEC from the off state to the on state and driving the TEC to transfer heat from the first coolant loop to the second coolant loop in response to determining that power consumption of a first component bank has dropped below a threshold, the first component bank being cooled by the first coolant loop.

In some aspects, the techniques described herein relate to a method, wherein the method further includes selectively toggling the TEC from the on state to the off state in response to determining that the power consumption of the first component bank has increased above the threshold.

In some aspects, the techniques described herein relate to a method, wherein the method further includes selectively toggling the TEC from the off state to the on state in response to determining that a temperature differential between the first coolant loop and the second coolant loop exceeds a threshold.

In some aspects, the techniques described herein relate to a device including: a first active cooling source that circulates a first cooling media through a first coolant loop of the device, the first coolant loop positioned to providing cooling to a first bank of processors; a second first active cooling source that circulates a second cooling media through a second coolant loop of the device, the second coolant loop positioned to provide cooling to a second bank of processors; a thermoelectric cooler (TEC) configured to transfer heat between the first coolant loop and the second coolant loop; and control electronics configured to selectively drive the TEC to transfer heat from the first coolant loop to the second coolant loop based on a current power consumption rate of the device.

In some aspects, the techniques described herein relate to a device, wherein the control electronics are configured to selectively drive the TEC in a power on state at times when total power consumption of the device is below a predefined threshold and to selectively maintain the TEC in a power off state at times when total power consumption of the device is above the predefined threshold.

In some aspects, the techniques described herein relate to a device, wherein the first cooling media is air and the first coolant loop includes an air-cooled heat-sink thermally coupled to a first side of the TEC.

In some aspects, the techniques described herein relate to a device, wherein the second cooling media is a liquid coolant and the second coolant loop includes a cold plate thermally coupled to a second side of the TEC opposite the first side of the TEC.

The logical operations described herein are implemented as logical steps in one or more computer systems. The logical operations may be implemented (1) as a sequence of processor-implemented steps executing in one or more computer systems and (2) as interconnected machine or circuit modules within one or more computer systems. The implementation is a matter of choice, dependent on the performance requirements of the computer system being utilized. Accordingly, the logical operations making up the implementations described herein are referred to variously as operations, steps, objects, or modules. Furthermore, it should be understood that logical operations may be performed in any order, unless explicitly claimed otherwise or a specific order is inherently necessitated by the claim language. The above specification, examples, and data, together with the attached appendices, provide a complete description of the structure and use of example implementations.

What is claimed is:

1. A device cooling system including:

an air coolant loop that circulates air through a device;

a liquid coolant loop that circulates liquid through the device;

a thermoelectric cooler (TEC) positioned between the air coolant loop and the liquid coolant loop; and control electronics to selectively drive the TEC to mitigate power oscillations for the device, the control electronics configured to:

selectively toggle the TEC from an off state to an on state to transfer heat away from the liquid coolant loop and into the air coolant loop responsive to determining that power consumption of the device is less than a predefined threshold; and selectively toggle the TEC from the on state to the off state responsive to determining that power consumption of the device is no longer less than a predefined threshold.

2. The device cooling system of claim 1, wherein the air coolant loop includes an air-cooled heat-sink thermally coupled to a first side of the TEC.

3. The device cooling system of claim 2, wherein the liquid coolant loop includes a cold plate thermally coupled to a second side of the TEC opposite the first side of the TEC.

4. The device cooling system of claim 1, wherein the air coolant loop includes a first cold plate thermally coupled to a first side of the TEC and the liquid coolant loop includes a second cold plate thermally coupled to a second side of the TEC opposite the first side.

5. The device cooling system of claim 1, wherein the control electronics are configured to selectively drive the TEC to minimize total energy consumption of the device cooling system by selectively transferring heat between the air coolant loop and the liquid coolant loop.

6. The device cooling system of claim 1, wherein control electronics are configured to selectively drive the TEC to selectively transfer heat between the air coolant loop and the liquid coolant loop to maintain temperature of a heat-generating component of the device within a target temperature range.

7. The device cooling system of claim 1, where the control electronics drive the TEC by selectively altering a direction of the heat transfer in response to:

detecting that a temperature differential between the air and the liquid exceeds a predefined threshold.

8. A method for operating a cooling system in a device, the method comprising:

selectively driving a thermoelectric cooler (TEC) to mitigate power oscillations for the device by performing operations that include:

selectively toggling the TEC of the device from an off state to an on state to transfer heat away from a liquid coolant loop and into an air coolant loop responsive to determining that power consumption of the device is less than a predefined threshold, the TEC being positioned to transfer heat between the air coolant loop circulating air and the liquid coolant loop circulating liquid; and selectively toggling the TEC from the on state to the off state responsive to determining that power consumption of the device is no longer less than a predefined threshold.

9. The method of claim 8, wherein the air coolant loop includes an air-cooled heat-sink thermally coupled to a first side of the TEC.

10. The method of claim 9, wherein the liquid coolant loop includes a cold plate thermally coupled to a second side of the TEC opposite the first side of the TEC.

11. The method of claim 8, wherein the air coolant loop includes a first cold plate thermally coupled to a first side of the TEC and the liquid coolant loop includes a second cold plate thermally coupled to a second side of the TEC opposite the first side.

12. The method of claim 8, wherein the method further comprises selectively toggling the TEC from the off state to the on state and driving the TEC to transfer heat from the air coolant loop to the liquid coolant loop in response to determining that power consumption of a first component bank has dropped below a threshold, the first component bank being cooled by the air coolant loop.

13. The method of claim 12, wherein the method further comprises selectively toggling the TEC from the on state to the off state in response to determining that the power consumption of the first component bank has increased above the threshold.

14. The method of claim 8, wherein the method further comprises selectively toggling the TEC from the off state to the on state in response to determining that a temperature differential between the air coolant loop and the liquid coolant loop exceeds a threshold.

15. The device cooling system of claim 1, wherein the control electronics are further configured to:

selectively toggle the TEC of the device from the off state to the on state to transfer heat away from a liquid coolant loop and into an air coolant loop responsive to determining that a temperature of the device exceeds a predefined threshold.

16. The device cooling system of claim 1, wherein the control electronics are further configured to:

selectively toggle the TEC of the device from the off state to the on state to transfer heat away from a liquid coolant loop and into an air coolant loop responsive to determining that driving the TEC reduces a total energy consumption of the device while maintaining target operating temperature ranges in the liquid coolant loop.

* * * * *